(12) United States Patent
McAlister

(10) Patent No.: US 8,980,416 B2
(45) Date of Patent: Mar. 17, 2015

(54) ARCHITECTURAL CONSTRUCT HAVING FOR EXAMPLE A PLURALITY OF ARCHITECTURAL CRYSTALS

(75) Inventor: Roy Edward McAlister, Phoenix, AZ (US)

(73) Assignee: McAlister Technologies, LLC, Phoenix, AZ (US)

( * ) Notice: Subject to any disclaimer, the term of this patent is extended or adjusted under 35 U.S.C. 154(b) by 655 days.

(21) Appl. No.: 13/027,214

(22) Filed: Feb. 14, 2011

(65) Prior Publication Data

US 2011/0206915 A1    Aug. 25, 2011

Related U.S. Application Data

(63) Continuation-in-part of application No. 12/857,515, filed on Aug. 16, 2010, now Pat. No. 8,147,599, which is a continuation-in-part of application No. PCT/US2010/024497, filed on Feb. 17, 2010, and a (Continued)

(51) Int. Cl.
  *B32B 7/02*    (2006.01)
(52) U.S. Cl.
  CPC ............. *B32B 7/02* (2013.01); *B32B 2419/00* (2013.01)
  USPC ...................................................... 428/213
(58) Field of Classification Search
  CPC ........ B32B 27/32; B32B 27/08; B32B 15/08; B32B 27/00; C08I 23/0815
  USPC ...................................................... 428/213
  See application file for complete search history.

(56) References Cited

U.S. PATENT DOCUMENTS

| | | | |
|---|---|---|---|
| 4,407,238 | A | 10/1983 | Yoon |
| 4,567,857 | A | 2/1986 | Houseman et al. |
| 4,600,529 | A | 7/1986 | Hallen et al. |
| 5,067,447 | A | 11/1991 | Iwaki et al. |
| 5,220,080 | A | 6/1993 | Lyons et al. |
| 5,269,953 | A | 12/1993 | Whewell |
| 5,407,245 | A | 4/1995 | Geropp |
| 6,015,041 | A | 1/2000 | Heung |

(Continued)

FOREIGN PATENT DOCUMENTS

| | | |
|---|---|---|
| JP | H0940491 | 2/1997 |
| JP | 2002158175 | 5/2002 |
| WO | WO01-13032 A1 | 2/2001 |

OTHER PUBLICATIONS

"Dopant." Wikipedia, the Free Encyclopedia. Published: Oct. 14, 2010. Accessed: Nov. 11, 2010. Printed: Jun. 1, 2011. <http://en.wikipedia.org/wiki/Dopant>. pp. 1-3.

(Continued)

*Primary Examiner* — Aaron Austin
*Assistant Examiner* — Tahseen N Khan
(74) *Attorney, Agent, or Firm* — Loeb & Loeb LLP

(57) ABSTRACT

An architectural construct is a synthetic material that includes a matrix characterization of different crystals. An architectural construct may be comprised of, for example, graphene, graphite, or boron nitride. It may be configured as a solid mass or as parallel layers that may be as thin as a single atom. In large part, its configuration determines how it behaves under a variety of conditions. In implementations in which it is arranged as parallel layers, the architectural construct can be configured to behave in a desirable manner by selecting the layers' thicknesses, their composition, the amount of distance between them, and/or another variable.

21 Claims, 7 Drawing Sheets

Related U.S. Application Data continuation-in-part of application No. 12/707,651, filed on Feb. 17, 2010, now Pat. No. 8,075,748, said application No. 12/857,515 is a continuation-in-part of application No. 12/707,653, filed on Feb. 17, 2010, now Pat. No. 8,172,990, and a continuation-in-part of application No. PCT/US2010/024499, filed on Feb. 17, 2010, and a continuation-in-part of application No. 12/707,656, filed on Feb. 17, 2010, now Pat. No. 8,075,749, and a continuation-in-part of application No. PCT/US2010/024498, filed on Feb. 17, 2010.

(60) Provisional application No. 61/304,403, filed on Feb. 13, 2010, provisional application No. 61/153,253, filed on Feb. 17, 2009, provisional application No. 61/237,476, filed on Aug. 27, 2009.

(56) References Cited

U.S. PATENT DOCUMENTS

| | | | |
|---|---|---|---|
| 6,503,584 B1 * | 1/2003 | McAlister | 428/34.1 |
| 6,538,892 B2 | 3/2003 | Smalc | |
| 6,709,497 B2 | 3/2004 | Myasnikov et al. | |
| 6,854,788 B1 | 2/2005 | Graham | |
| 7,112,239 B2 | 9/2006 | Kimbara et al. | |
| 7,138,889 B2 | 11/2006 | Lakin | |
| 7,152,908 B2 | 12/2006 | Shahbazi | |
| 7,172,645 B1 | 2/2007 | Pfister et al. | |
| 7,210,467 B2 | 5/2007 | Kweon et al. | |
| 7,306,862 B2 | 12/2007 | Kramer et al. | |
| 7,320,726 B2 | 1/2008 | Shih et al. | |
| 8,147,599 B2 | 4/2012 | McAlister | |
| 2004/0056566 A1 | 3/2004 | Rubach | |
| 2004/0076561 A1 | 4/2004 | Kajiura et al. | |
| 2004/0191589 A1 | 9/2004 | Katamura et al. | |
| 2004/0247957 A1 | 12/2004 | Hatano et al. | |
| 2006/0216222 A1 | 9/2006 | Jang | |
| 2007/0138006 A1 | 6/2007 | Oakes et al. | |

OTHER PUBLICATIONS

"Doping (semiconductor)" Wikipedia, the Free Encyclopedia. Published: Oct. 12, 2010. Accessed: Nov. 11, 2010. Printed: Jun. 1, 2011. <http://en.wikipedia.org/wiki/Dopant>. pp. 1-4.

"Electrifying New Way to Clean Dirty Water." University of Utah, Published: Jan. 5, 2011. Accessed: Jun. 1, 2011. <http://www.unews.utah.edu/old/p/010511-1.html>.

"Expitaxy." Wikipedia, the Free Encyclopedia. Published: Oct. 18, 2010. Accessed: Nov. 11, 2010. Printed: Jun. 1, 2011. <http://en.wikipedia.org/wiki/Dopant>. pp. 1-4.

"Glossary of Semiconductor Physics, Optoelectronic and Photonics." Accessed: Nov. 10, 2010 Printed: Jun. 1, 2011. <http://britneyspears.ac/physics/lipgloss/gloss.htm>. pp. 1-10.

APS Physics. "This Month in Physics History: Oct. 2009." Published: Oct. 2009. Accessed: Jun. 1, 2011. <http://www.aps.org/publications/apsnews/200910/physicshistory.cfm>. pp. 1-3.

Bourzac, Katherine. "Bringing Graphene to Market." Technology Review. Published: Aug. 6, 2009. Accessed: May 31, 2011. <http://www.technologyreview.com/printer_friendly_article.aspx?id=23129>. pp. 1-2.

Carmody, Tim. "Why Graphene Won Scientists the Nobel Prize." Wired, Published: Oct. 5, 2010. Accessed: May 31, 2011. <http://www.wired.com/gadgetlab/2010/10/graphene/>. pp. 1-7.

Cho, Adrian. "Still in Its Infancy, Two-Dimensional Crystal Claims Prize." Science. Oct. 8, 2010. p. 159. <http://www.sciencemag.org/cgi/content/full/330/6001/159>.

CNN Wire Staff. "Research into Graphene Wins Nobel Prize." CNN.com. Published: Oct. 5, 2010. Accessed: Jun. 1, 2011. <http://edition.cnn.com/2010/Living/10/05/sweden.nobel.physics/index.html?hpt=T2>. pp. 1-2.

Elias et al. "Control of Graphene's Properties by Reversible Hydrogenation: Evidence for Graphane." Science. Jan. 30, 2009. pp. 610-613. <http://www.sciencemag.org/cgi/content/full/323/5914/610>.

Geim, A.K. "Graphene: Status and Prospects." Science. Jun. 19, 2009 pp. 1530-1534. <http://www.sciencemag.org/cgi/content/full/324/5934/1530>.

Kumenko et al."Universal Optical Coductance of Graphite". Published: Mar. 20, 2008 Printed: Jun. 13, 2011 4 Pages.

Kuzmenko et al. "Universal Optical Conductance of Graphite." Physical Review Letters, vol. 100, Issue 11. Mar. 21, 2008. pp. 117401-1-117401-4.

Nair et al. "Fine Structure Constant Defines Visual Transparency of Graphene." Science. Jun. 6, 2008. p. 1308. <http://www.sciencemag.org/cgi/content/full/320/5881/1308>.

Novoselov et al. "Electric Field Effect in Atomically Thin Carbon Films." Science. Oct. 22, 2004. pp. 666-669. <http://www.sciencemag.org/cgi/content/full/306/5696/666>.

Novoselov et al. "Room-Temperature Quantum Hall Effect in Graphene." Science. Feb. 15. 2007. p. 1379. <http://www.sciencemag.org/cgi/content/full/315/5817/1379>.

Patel, Prachi. "Graphene Could Improve DNA Sequencing." Technology Review, Published: Aug. 19, 2010. Accessed: May 31, 2011. <http://www.technologyreview.com/printer_friendly_article.aspx?id=26087>. pp. 1-2.

Ponomarenko et al. "Chaotic Dirac Billiard in Graphene Quantum Dots." Science. Apr. 18, 2008. pp. 356-358. <http://www.sciencemag.org/cgi/content/full/320/5874/356>.

Rincon, Paul. "Materials Breakthrough Wins Nobel." BBC News, Published: Oct. 5, 2010. Accessed: Jun. 9, 2011. <http://www.bbc.co.uk/news/world-11476301?print=true>. pp. 1-4.

Sun et al. "High-pressure Laminar Flame Speeds and Kinetic Modeling of Carbon Monoxide/hydrogen Combustion." Proceedings of the Combustion Institute, vol. 31, Issue 1, (2007). pp. 439-446.

International Search Report and Written Opinion for PCT Application No. PCT/US11/24806; Applicant: McAlister Technologies, LLC; Date of Mailing: Feb. 14, 2011; 9 pages.

Cheng et al. "A multilayer structured acoustic cloak with homogeneous isotropic materials." American Institute of Physics, vol. 92, (2008). pp. 151913.

Sanchis et al. "Acoustic interferometers based on two-dimensional arrays of rigid cylinders in air." Physical Review, vol. 67, (2003), p. 35422.

"Science Friday Archives: Physics Nobel for Graphene." *Science Friday*. Oct. 8, 2010. Web. Oct. 6, 2010. <http://www.sciencefriday.com/program/archives/201010082>.

International Search Report and Written Opinion for PCT Application No. PCT/US2012/050638; Applicant: McAlister Technologies, LLC; Date of Mailing: Feb. 18, 2013; 9 pages.

European Search Report for Application EP 11742993.6; Dated Dec. 12, 2013; 5 pages.

* cited by examiner

US 8,980,416 B2

ARCHITECTURAL CONSTRUCT HAVING FOR EXAMPLE A PLURALITY OF ARCHITECTURAL CRYSTALS

CROSS-REFERENCE TO RELATED APPLICATION(S)

The present application claims priority to and the benefit of U.S. Patent Application No. 61/304,403, filed on Feb. 13, 2010 and titled FULL SPECTRUM ENERGY AND RESOURCE INDEPENDENCE. The present application is a continuation in part of: U.S. patent application Ser. No. 12/857,515, filed on Aug. 16, 2010 and titled APPARATUSES AND METHODS FOR STORING AND/OR FILTERING A SUBSTANCE, which claims priority to and the benefit of U.S. Provisional Application No. 61/304,403, filed Feb. 13, 2010 and titled FULL SPECTRUM ENERGY AND RESOURCE INDEPENDENCE. U.S. patent application Ser. No. 12/857,515 is also a continuation-in-part of each of the following applications: U.S. patent application Ser. No. 12/707,651, filed Feb. 17, 2010 and titled ELECTROLYTIC CELL AND METHOD OF USE THEREOF; PCT Application No. PCT/US10/24497, filed Feb. 17, 2010 and titled ELECTROLYTIC CELL AND METHOD OF USE THEREOF; U.S. patent application Ser. No. 12/707,653, filed Feb. 17, 2010 and titled APPARATUS AND METHOD FOR CONTROLLING NUCLEATION DURING ELECTROLYSIS; PCT Application No. PCT/US10/24498, filed Feb. 17, 2010 and titled APPARATUS AND METHOD FOR CONTROLLING NUCLEATION DURING ELECTROLYSIS; U.S. patent application Ser. No. 12/707,656, filed Feb. 17, 2010 and titled APPARATUS AND METHOD FOR GAS CAPTURE DURING ELECTROLYSIS; and PCT Application No. PCT/US10/24499, filed Feb. 17, 2010 and titled APPARATUS AND METHOD FOR CONTROLLING NUCLEATION DURING ELECTROLYSIS; each of which claims priority to and the benefit of the following applications: U.S. Provisional Patent Application No. 61/153,253, filed Feb. 17, 2009 and titled FULL SPECTRUM ENERGY; U.S. Provisional Patent Application No. 61/237,476, filed Aug. 27, 2009 and titled ELECTROLYZER AND ENERGY INDEPENDENCE TECHNOLOGIES; U.S. Provisional Application No. 61/304,403, filed Feb. 13, 2010 and titled FULL SPECTRUM ENERGY AND RESOURCE INDEPENDENCE. Each of these applications is incorporated herein by reference in its entirety. To the extent the foregoing application and/or any other materials incorporated herein by reference conflict with the disclosure presented herein, the disclosure herein controls.

TECHNICAL FIELD

The present technology relates to a material that includes a matrix characterization of different crystals.

BACKGROUND

Technology has progressed more during the last 150 years than during any other time in history. Integral to this innovation has been the exploitation of the properties exhibited by both new and existing materials. For example, silicon, being a semiconductor, has been transformed into processors; and steel, having a high tensile strength, has been used to construct the skeletons of skyscrapers. Future innovations will similarly depend on exploiting the useful properties of new and existing materials.

A material's usefulness depends on its application. A material exhibiting a combination of useful properties is especially useful as it may enable or improve some technology. For example, computer processors rely on multitudes of transistors, each of which outputs a voltage equivalent to a binary 1 or 0 depending on its input. Few materials are suitable as transistors. But semiconductor materials have unique properties that facilitate a transistor's binary logic, making semiconductors especially useful for computer hardware.

Technology will continue to progress. Engineers and scientists will continue creating novel inventions. Implementing these ideas will depend on materials that can be configured to behave in new and desirable ways.

DETAILED DESCRIPTION

Overview

Figure 1A:
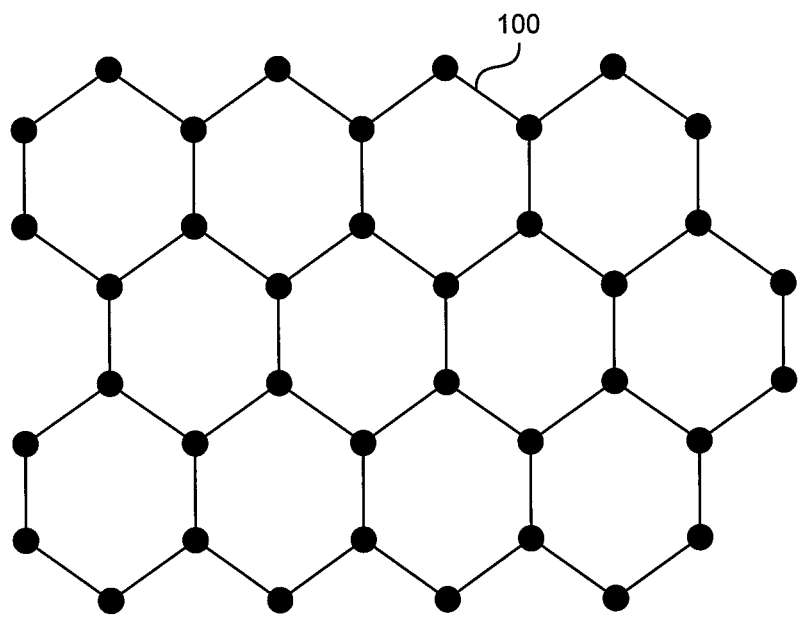
FIG. 1A is a diagram showing a molecular structure of a matrix characterization of crystals.

Architectural constructs are described herein that are configurable so as to exhibit useful properties. An architectural construct includes a synthetic matrix characterization of crystals. These crystals can be primarily composed of carbon, boron nitride, mica, or another material. The matrix characterization of crystals can be configured as a solid mass, as layers that are as thin as an atom (e.g., graphene), or in other arrangements and variations. In some implementations, an architectural construct includes a matrix characterization of crystals incorporated in a non-crystalline matrix, such as a glass or polymer. In some implementations, an architectural construct includes a matrix characterization of crystals that has been loaded with a substance, such as hydrogen. In some implementations, an architectural construct is configured to have particular mechanical properties. The crystals of an architectural construct have matrix attributes or arrangements. The crystals of an architectural construct are specialized (e.g., arranged in a specific configuration) so that the architectural construct exhibits particular properties. Five sets of properties of an architectural construct are especially exploitable technologically: (i) a construct's thermal properties; (ii) its electromagnetic, optical, and acoustic properties; (iii) its catalytic properties; (iv) its capillary properties; and (v) its sorptive properties.

An architectural construct can be designed to utilize some or all of these properties for a particular application. As discussed in detail below, an architectural construct's behavior depends on its composition, surface structures located on its layers, its layer orientation, its dopants, and the coatings (including catalysts) that are applied to its surfaces. When it is configured as layers, its behavior also depends on the thicknesses of its layers, spacers between its layers, the distances separating its layers, and the means used for supporting its layers and/or separating its layers. An architectural construct is a macro-structure designed to facilitate micro-processing on a nano-scale. From a macroscopic standpoint, it can be configured to have a specific density, electrical conductivity, magnetic characteristic, specific heat, optical characteristic, modulus of elasticity, and/or section modulus. And it can be designed so that from a microscopic standpoint it acts as a molecular processor, magnetic domain support, charge processor, and/or bio processor.

Various embodiments of the invention will now be described. The following description provides specific details for a thorough understanding and an enabling description of these embodiments. One skilled in the art will understand, however, that the invention may be practiced without many of these details. Additionally, some well-known structures or functions may not be shown or described in detail in order to avoid unnecessarily obscuring the relevant description of the various embodiments. The terminology used in the description presented below is intended to be interpreted in its broadest reasonable manner, even though it is being used in conjunction with a detailed description of certain specific embodiments of the invention.

Architectural Constructs

An architectural construct includes a synthetic matrix characterization of crystals. The crystals are composed of carbon, boron nitride, mica, or another suitable substance. The configuration and treatment of these crystals heavily influence the properties that the architectural construct will exhibit, especially when it experiences certain conditions. Many of these properties are described below, and they are discussed in relation to five categories of properties. These categories include the following: (i) thermal properties; (ii) electromagnetic, optical, and acoustic properties; (iii) catalytic properties; (iv) capillary properties; and (v) sorptive properties. Although they are grouped in this way, properties from different sets are sometimes interrelated or associated with one another. Accordingly, an architectural construct can be configured to exhibit some or all of the properties discussed throughout this specification.

An architectural construct can be configured in many ways. A designer can arrange it as a solid mass (e.g., as multiple single-atom-thick layers stacked upon each other), as multiple layers that are spaced apart and as thin as an atom, or in another configuration through which it will exhibit a desirable property. A designer can also dope the construct or coat its surfaces with a substance or with surface structures, each of which causes it to behave in a different way than it would have otherwise. For example, surfaces of an architectural construct can be coated with surface structures or coatings composed of carbon, boron, nitrogen, silicon, sulfur, and/or transition metals. These and other variations are detailed further below with reference to various implementations of architectural constructs.

FIG. 1A shows a molecular diagram of a layer of a matrix characterization of crystals 100 according to some implementations. The layer may include carbon, boron nitride, mica, or another suitable material. For example, the matrix characterization of crystals 100 may be a layer of graphene. A layer of a matrix characterization of crystals like that shown in FIG. 1A can be configured as an architectural construct by specializing the layer, such as by doping the layer or arranging the layer with other layers in a particular configuration so that the resulting construct exhibits a particular property.

Figure 1B:
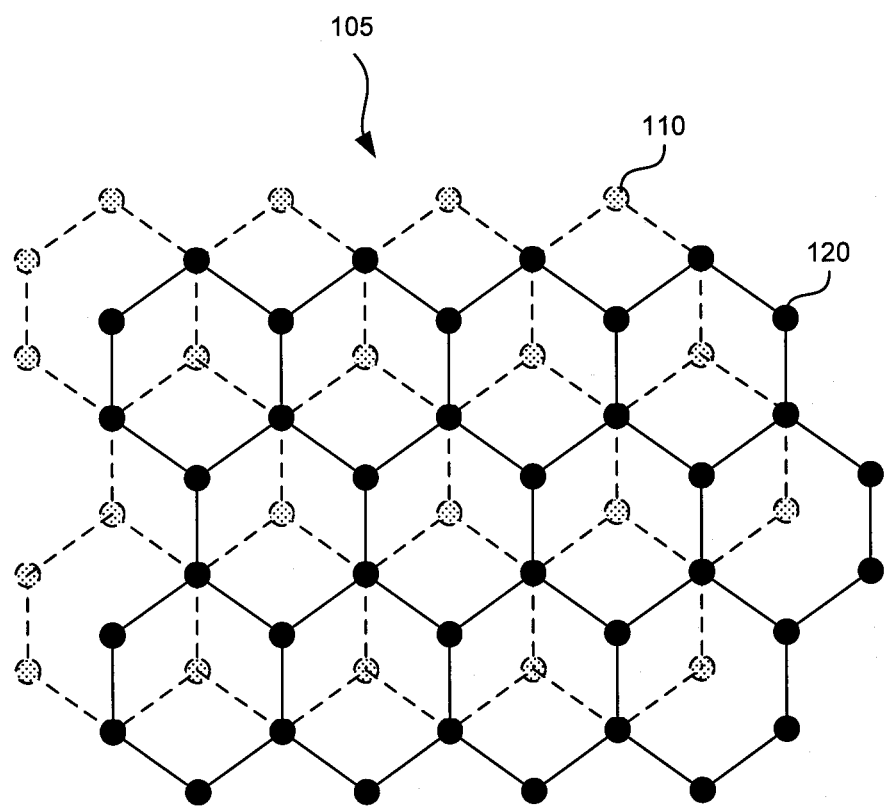
FIG. 1B is a diagram showing a molecular structure of two layers of a matrix characterization of crystals of an architectural construct.
Figure 1C:
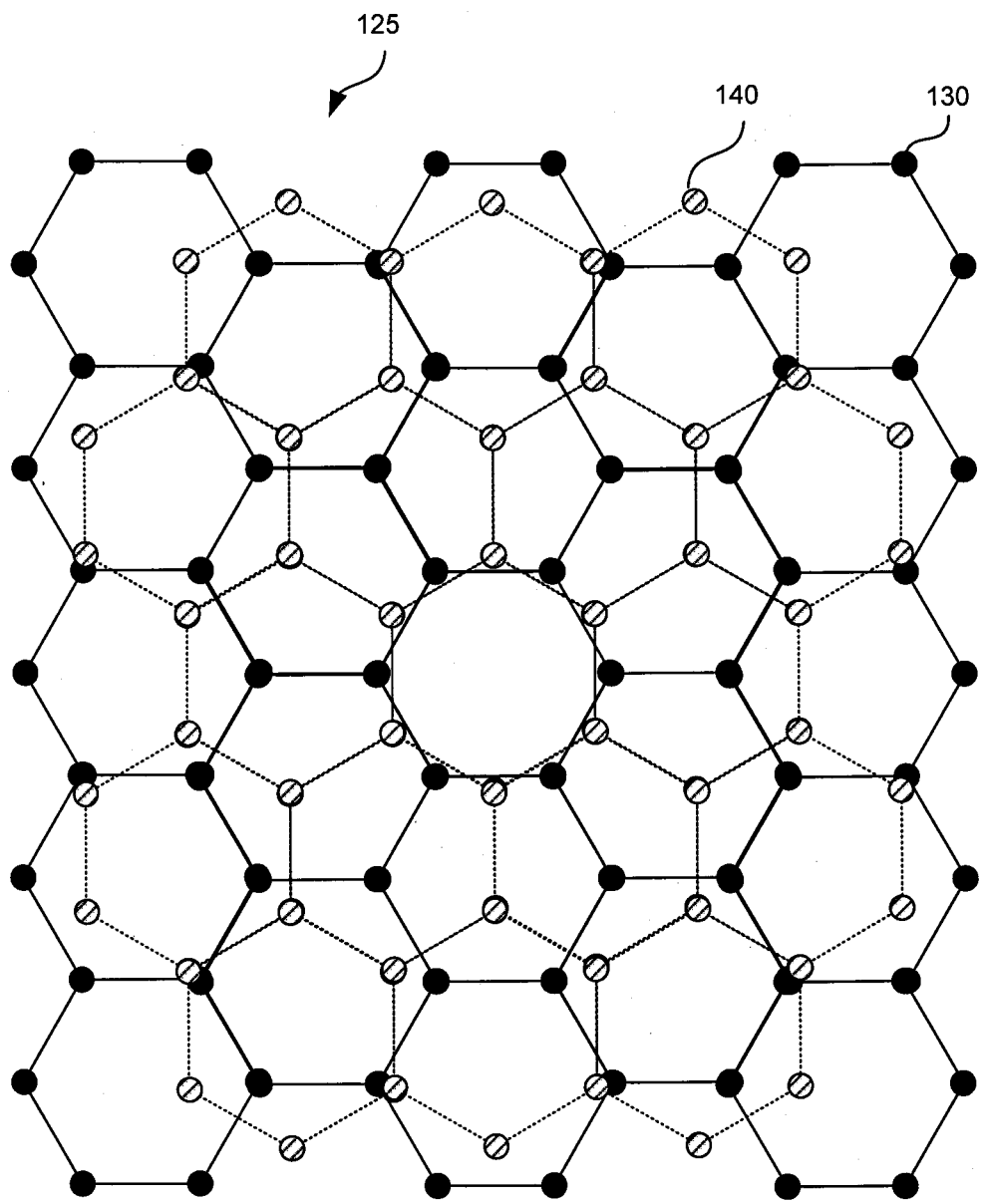
FIG. 1C is another diagram showing a molecular structure of two layers of a matrix characterization of crystals of an architectural construct.

Layers of a matrix characterization of crystals that form an architectural construct can be configured stacked together as a layer that is thicker than an atom (e.g., graphene stacked to form graphite) and/or spaced apart from each other by particular distances. Furthermore, layers of an architectural construct can be oriented with respect to each other in various ways. FIG. 1B shows a diagram of an architectural construct 105 that includes a first layer 110 of a matrix characterization of crystals arranged on a second layer 120 of a matrix characterization of crystals. The first layer 110 is offset and parallel relative to the second layer 120 so that when viewed from above some atoms of the first layer 110 align within the zone between atoms of the second layer. In the example shown, each atom of the first parallel layer is approximately centered within a hexagon formed by atoms of the second layer 120. In some implementations, first and second layers of an architectural construct are configured so that atoms of the first layer and atoms of the second layer vertically align. For example, a structural diagram of an architectural construct including two layers whose atoms vertically align is represented by FIG. 1A. FIG. 1C shows a molecular diagram of an architectural construct 125 including a first layer 130 and a second layer 140 of a matrix characterization of crystals. The first layer 130 is rotated relative to the second layer by 30 degrees. In some implementations, a first layer of an architectural construct includes a first substance, such as carbon, and a second layer of the construct includes a second substance, such as boron nitride. Layers composed of or doped with different substances may not appear planar as larger molecules warp or increase the separation of planar surfaces. As further detailed below, some properties of an architectural construct are influenced by the orientation of its layers relative to one another. For example, a designer can rotate or shift a first layer of a construct relative to a second layer of the construct so that the construct exhibits particular optical properties, including a specific optical grating.

Figure 2:
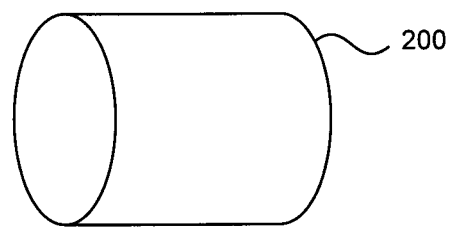
FIG. 2 is an isometric view of an architectural construct configured as a solid mass.

FIG. 2 shows an isometric view of an architectural construct 200 that is configured as a solid mass. The architectural construct 200 can include, for example, graphite or boron nitride. An architectural construct configured as a solid mass includes multiple single-atom-thick layers stacked together in various orientations. An architectural construct configured as a solid mass is specialized, meaning it has been altered to behave in a specific way. In some implementations, a solid mass is specialized by doping or by orienting its single-atom-thick layers a particular way with respect to one another.

An architectural construct can be composed of a single substance (e.g., boron nitride) or it can be specialized by being doped or reacted with other substances. For example, an architectural construct including graphene may have areas that are reacted with boron to form both stoichiometric and non-stoichiometric subsets. The graphene can be further specialized with nitrogen and can include both carbon graphene and boron nitride graphene with a nitrogen interface. In some implementations, compounds are built upon the architectural construct. For example, from a boron nitride interface, a designer can build magnesium-aluminum-boron compounds.

In some implementations, the edges of a layer of an architectural construct are reacted with a substance. For example, silicon may be bonded on the edges to form silicon carbide, which forms stronger bonds between the construct and other matter and/or to change the construct's optical characteristics or another property such as specific heat. By specializing an architectural construct in such ways, a designer can create a construct that exhibits different properties than a construct composed of only one type of atoms.

Figure 3:
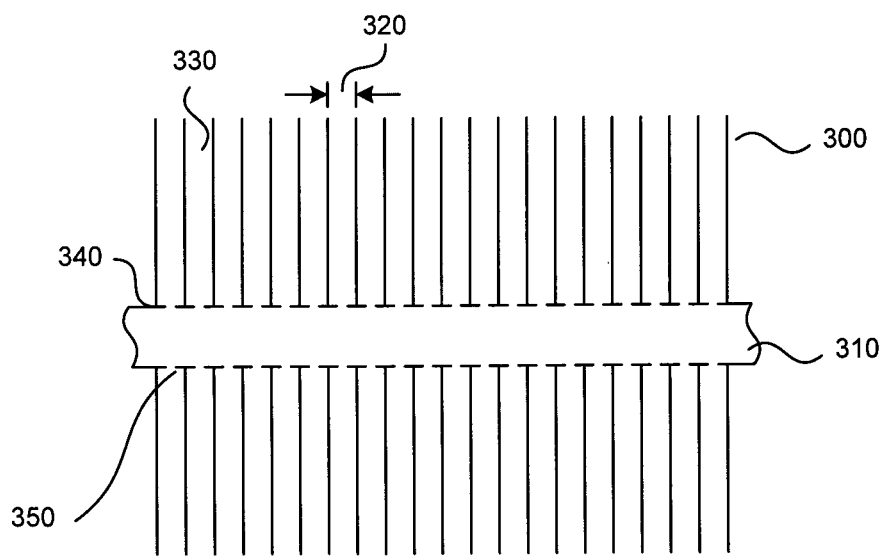
FIG. 3 is a cross-sectional side view of an architectural construct configured as parallel layers.

Architectural constructs including parallel layers spaced apart from one another are capable of yielding a wide range of properties and achieving many outcomes. FIGS. 3-11 show architectural constructs configured according to some implementations. FIG. 3 is a cross-sectional side view of an architectural construct 300 configured as parallel layers. Parallel layers of an architectural construct may be comprised of any of a number of substances, such as graphene, graphite, or boron nitride. Parallel layers may be rectangular, circular, or another shape. In FIG. 3, the layers are circular and include a hole through which a support tube 310 supports the architectural construct 300. The layers are each separated by a distance 320, characterizing zones 330 between the layers.

There are a number of approaches for creating architectural constructs like those shown in FIGS. 1-11. One is to deposit or machine a single crystal into a desired shape and to heat treat or utilize other methods to exfoliate the single crystal into layers. As an example, the crystal is warm-soaked in a fluid substance, such as hydrogen, until a uniform or non-uniform concentration of the fluid diffuses into the crystal. The crystal may be coated with substances that catalyze this process by helping the fluid enter the crystal. Catalysts may also control the depth to which the fluid diffuses into the crystal, allowing layers that are multiple-atoms thick to be exfoliated from the crystal. Sufficient coatings include the platinum metal group, rare earth metals, palladium-silver alloys, titanium and alloys of iron-titanium, iron-titanium-copper, and iron-titanium-copper-rare earth metals. A thin coating of a catalyst may be applied by vapor deposition, sputtering, or electroplating techniques. The coatings may be removed after each use and reused on another crystal after it has allowed the diffusion of fluid into the crystal. In some implementations, dopants or impurities are introduced into the crystal at a particular depth to encourage the fluid to diffuse to that depth so that layers that are multiple-atoms thick can be exfoliated from the crystal.

The soaked crystal may be placed in a temporary container or it may be encased in an impermeable pressure vessel. Pressure may be suddenly released from the container or vessel, causing the fluid impregnate to move into areas where the packing is least dense and form gaseous layers. Gas pressure causes the exfoliation such as of each 0001 plane. Additional separation can be created by repeating this process with successively larger molecules, such as methane, ethane, propane, and butane. The 0001 planes can be separated by a particular distance by controlling the amount and type of fluid that enters the crystal and the temperature at the start of expansion. The layers of the architectural construct can be oriented in a position with respect to one another (i.e., offset and/or rotated as discussed above with respect to FIGS. 1A-C) by applying trace crystal modifiers, such as neon, argon, or helium, at the time of a layer's deposition, through a heat treatment that moves the structure to a particular orientation, or through torque of the crystal during exfoliation.

In some implementations, before it is exfoliated, one or more holes may be bored in the crystal so that it accommodates a support structure, like the support tube 310 that supports the architectural construct 300 illustrated in FIG. 3. A support structure may be configured within a crystal before it is exfoliated to support the architectural construct as it is created. Or the support structure can be placed in the architectural construct after the crystal has been exfoliated. A support structure may also be used to fix the layers of an architectural construct at a particular distance apart from one another. In some implementations, a support structure may be configured along the edges of an architectural construct's layers (e.g., as a casing for an architectural construct that is comprised of parallel layers).

Figure 4:
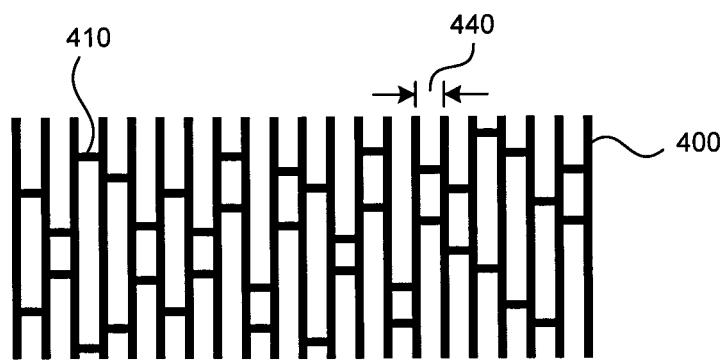
FIG. 4 is a side view of an architectural construct configured as parallel layers.

Layers of an architectural construct can be made to have any thickness. In FIG. 3, each of the parallel layers of the architectural construct 300 is an atom thick. For example, each layer may be a sheet of graphene. In some implementations, the layers of the architectural construct are thicker than one atom. FIG. 4 is a side view of an architectural construct 400 configured as parallel layers. In the section shown, the layers of the architectural construct 400 are each thicker than one atom. For example, as discussed above with respect to FIGS. 1A-C, each layer may include multiple sheets of graphene stacked upon each other. An architectural construct may include parallel layers that are only one atom thick, a few atoms thick, or layers that are much thicker, such as 20 atoms or more.

Figure 5:
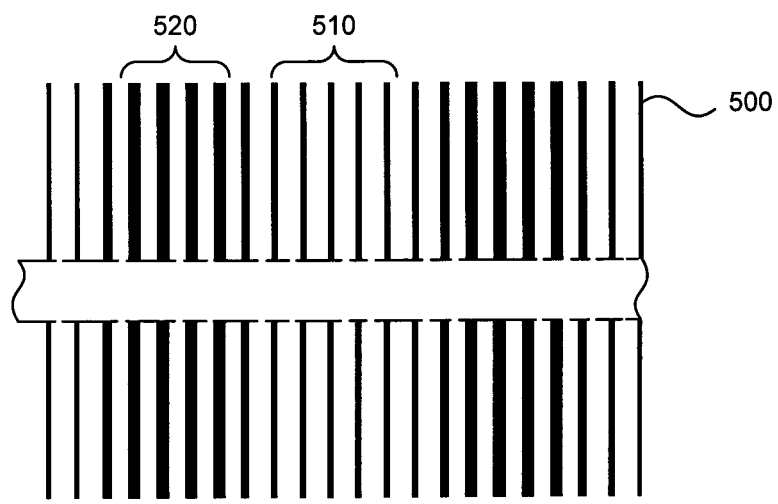
FIG. 5 is a cross-sectional side view of an architectural construct configured as parallel layers.

In some implementations, all the layers are the same thickness, while in other implementations the layers' thicknesses vary. FIG. 5 is a cross-sectional side view of an architectural construct 500 configured as parallel layers that have various thicknesses. As discussed above, layers thicker than an atom or differing from one another in thicknesses may be exfoliated from a single crystal by controlling the depth to which a fluid is diffused into the crystal to exfoliate the layers (e.g., by introducing impurities or dopants at the desired depth).

When an architectural construct is configured as parallel layers, the layers may be spaced an equal distance apart or by varying distances. Referring again to FIG. 3, a distance 320 separates each of the parallel layers characterizing zones 330 between each layer that are approximately equal in size. In FIG. 5, the distances between the layers of the architectural construct 500 vary. For example, the distance between the layers of a first set 510 of layers is greater than the distance between the layers of a second set 520 of layers, meaning that the zones between layers of the first set 510 are larger than those of the second set 520.

There are a number of techniques for arranging one layer a particular distance away from another layer. As mentioned above, one method is to configure the parallel layers on a support structure and exfoliate each layer a certain distance away from an adjacent layer. For example, a manufacturer can control both the volume of fluid and the distance that it is diffused into a single crystal for exfoliating a layer. Another method is to electrically charge or inductively magnetize each exfoliated layer and electrically or magnetically force the layers apart from one another. Diffusion bonding or a suitable adherent can secure the layers in place on the central tube at particular distances away from one another.

Another technique for establishing a particular distance between the layers is to deposit spacers between the layers. Spacers can be composed of titanium (e.g., to form titanium carbide with a graphene layer), iron (e.g., to form iron carbide with a graphene layer), boron, nitrogen, etc. Referring again to FIG. 4, the parallel layers 400 are separated with spacers 410. In some implementations, a gas is dehydrogenated on the surface of each layer, creating the spacers 410 where each particle or molecule is dehydrogenated. For example, after a layer of an architectural construct is exfoliated, methane may be heated on the surface of the layer, causing the methane molecules to split and deposit carbon atoms on the surface of the layer. The larger the molecule that is dehydrogenated, the larger the potential spacing. For example, propane, which has three carbon atoms per molecule, will create a larger deposit and area or space than methane, which has one carbon atom per molecule. In some implementations, parallel layers are configured on a central tube and the spacers are included between the layers. In some implementations, the spacers are surface structures, like nanotubes and nanoscrolls, which transfer heat and facilitate in the loading or un-loading of substances into an architectural construct. Architectural constructs that include these types of surface structures are described below with respect to FIGS. 10 and 11.

Figure 6:
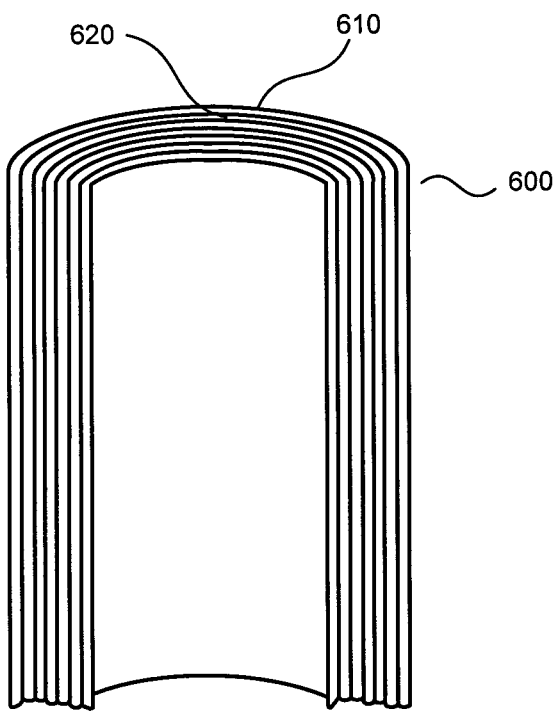
FIG. 6 is a cross-sectional side view of an architectural construct configured as concentric tubular layers.

FIG. 6 shows a cross-sectional side view of an architectural construct 600 configured as concentric tubular layers of a matrix characterization of crystals. For example, a first layer 610 of the architectural construct is tubular and has a diameter greater than a second layer 620 of the architectural construct, and the second layer 620 is configured within the first layer 610. An architectural construct configured as concentric tubes can be formed in many ways. One method is to dehydrogenate a gas, such as a hydrocarbon, within a frame to form the first layer 610 of the architectural construct 600, and to dehydrogenate a substance, such as titanium hydride, to form spacers (e.g., surface structures) on the inside surface of the first layer before dehydrogenating the first gas to form the second layer 620 on the spacers. Subsequent layers can then be deposited in a similar fashion. In some implementations, each tubular layer is formed by dehydrogenating a gas in its own frame. The dehydrogenated layers are then configured within one another in the configuration shown in FIG. 6. Spacers can be deposited on either the inside or outside surfaces of the layers to space them apart by a particular distance. In other instances, multiple wraps of a material such as polyvinyl fluoride or chloride are dehydrogenated to produce the desired architectural construct. In other instances, polyvinylidene chloride or fluoride are dehydrogenated to produce the desired architectural construct.

Figure 7:
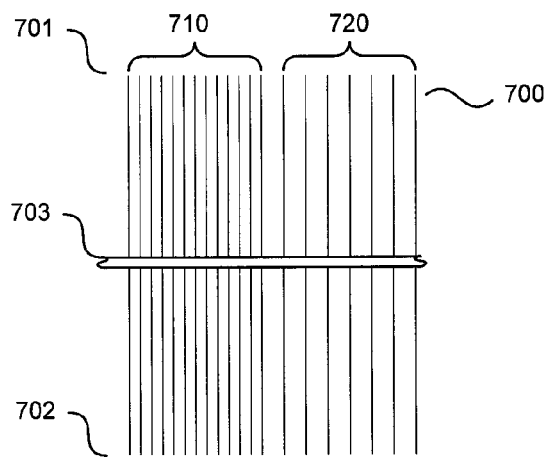
FIG. 7 is a cross-sectional side view of an architectural construct configured as parallel layers.
Figure 8:
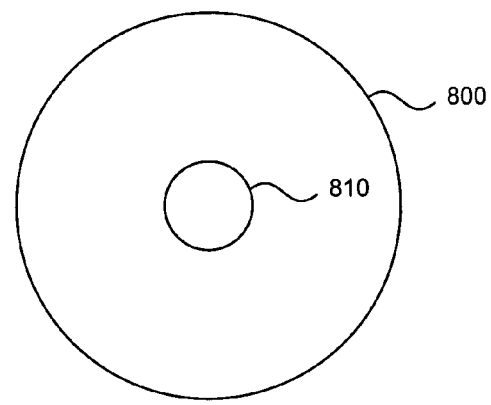
FIG. 8 is a side view of a layer of an architectural construct.
Figure 9:
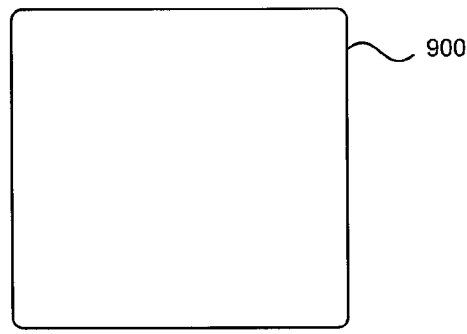
FIG. 9 is another side view of a layer of an architectural construct.

FIG. 7 is a cross-sectional side view of an architectural construct 700 comprised of parallel layers. A first set 710 of layers are spaced apart by a closer distance than a second set 720 of layers. The architectural construct 700 is discussed in further detail below with reference to some of the properties that it exhibits in this configuration. FIG. 8 is a side view of a layer 800 of an architectural construct. The layer 800 has a circular shape, and it includes a hole 810, through which a support structure may support the layer 800. FIG. 9 is a side view of a layer 900 of an architectural construct that has a rectangular shape with rounded corners. As mentioned above, if a layer is exfoliated from a single crystal, it can be machined into a particular shape either before or after exfoliation. Multiple layers like the layer 900 can be arranged together via, for example, a support structure configured on its edges or spacers configured on their surfaces. In some implementations, a surface of an architectural construct is treated with a substance. For example, a surface of an architectural construct can be coated with at least one of carbon, boron, nitrogen, silicon, sulfur, transition metals, carbides, and borides, which causes the architectural construct to exhibit a particular property. For example, as discussed below, a surface of an architectural construct can be treated so that it includes silicon carbide, which may change its electromagnetic and/or optical properties.

In some implementations, an architectural construct is configured to be non-sacrificial. For example, as explained below, an architectural construct can be configured to load molecules of a substance into zones between layers of the construct. A non-sacrificial construct can load and unload substances or perform other tasks without sacrificing any of its structure. In other implementations, an architectural construct is configured to sacrifice atoms from its crystalline structure to facilitate a particular result. For example, an architectural construct that is composed of boron nitride may be configured to load nitrogen, which the boron nitride will facilitate reaction with hydrogen to form ammonia and/or other nitrogenous substances. As a result, atoms from the construct will be sacrificed in the reaction with hydrogen, and when the product is unloaded from the construct, the architectural construct will have lost the sacrificed molecules of boron nitride. In some implementations, a construct that has sacrificed its structure can be restored or cyclically utilized in such reactions. For example, an architectural construct that is composed of boron nitride can be restored by presenting the construct with new nitrogen, boron, or boron nitride molecules and applying heat or another form of energy such as electromagnetic radiation. The new boron nitride structure may self-organize replacement of missing atoms into the original architectural construct.

An architectural construct can be designed so that it has certain properties such as a specific density, modulus of elasticity, specific heat, electrical resistance, and section modulus. These macroscopic characteristics affect the properties that an architectural construct exhibits. A construct's density is defined as its mass per unit volume. A number of different parameters affect an architectural construct's density. One is the composition of the matrix characterization of crystal. For example, a crystal of boron nitride generally has a higher density than a crystal of graphite depending upon factors such as disclosed regarding FIGS. 1A, 1B and 1C. Another is the distance separating the layers of an architectural construct. Increasing or decreasing the spacing between the layers will correspondingly increase or reduce an architectural construct's density. An architectural construct's density may also be greater in embodiments in which its layers are spaced apart by denser surface structures relative to embodiments in which the layers are similarly spaced but not by surface structures. An architectural construct's dopants can also change its density as desired.

An architectural construct's modulus of elasticity is its tendency to be deformed elastically when a force is applied to it (defined as the slope of its stress-strain curve in the elastic deformation region). Like its density, an architectural construct's modulus of elasticity depends in part on the thicknesses of its layers, their spacing, and their composition. Its modulus of elasticity will also depend on how the layers are fixed relative to one another. If the layers are supported by a central tube, like the support tube 310 of the architectural construct 300 shown in FIG. 3, the individual layers can generally elastically deform by a greater amount than if they are fixed relative to one another using spacers, like the spacers 410 between the layers of the architectural construct 400 shown in FIG. 4. For the most part, when spacers fix two layers relative to one another, each layer will reinforce the other when force is exerted on either, dampening the deflection that results from a given force. The amount that each layer reinforces each other layer is contingent, in part, on the concentration of spacers between the layers and how rigidly the spacers hold the layers together.

An architectural construct's section modulus is the ratio of a cross section's second moment of area to the distance of the extreme compressive fiber from the neutral axis. An architectural construct's section modulus will depend on the size and shape of each layer of architectural construct. For example, the section modulus of a rectangular layer of architectural construct is defined by the following equation:

$$S = \frac{bh^2}{6}, \quad (1)$$

where b is the base of the rectangle and h is the height. And the section modulus of a circle with a hole in its center is defined by the following equation:

$$S = \frac{\pi(d_2^4 - d_1^4)}{32 d_2}, \quad (2)$$

where $d_2$ is the diameter of the circle and $d_1$ is the diameter of the hole in the circle.

An architectural construct's density, modulus of elasticity, and section modulus can be constant throughout the architectural construct or they can vary by section or cyclically. Just as a construct's density, modulus of elasticity, or section modulus can affect the properties that are exhibited by the construct, varying these macroscopic characteristics either by section or cyclically can cause the architectural construct to behave differently at different parts of the construct. For example, by separating an architectural construct's layers in a first section by a greater amount than in a second section (thereby giving it a greater density in the second section than in the first), the architectural construct can be made to preferentially load a first substance in the first section and a second substance in the second section. In some implementations, an architectural construct is configured having particular mechanical properties. For example, an architectural construct can be configured as a support structure for an object. In some implementations, an architectural construct is configured having at least one of a particular fatigue endurance strength, yield strength, ultimate strength, and/or creep strength. In some implementations, an architectural construct is configured having a particular property, including these and the others discussed herein, including various anisentropic influences on the property.

I. Thermal Properties

An architectural construct can be configured to have specific thermal properties. Even when its crystalline layers readily conduct heat, an architectural construct can be configured to have either a high or low availability for conductively transferring heat. Illustratively, conduction perpendicular to the layers may be inhibited by the choice of spacing and spacers. It can also be configured so that radiative heat is transmitted through passageways or elsewhere within the construct, reflected away from the construct, or absorbed by the construct. This section describes various implementations of architectural constructs that are designed to have specific thermal behaviors.

A one-atom-thick graphene layer is seemingly mostly open space between defining carbon atoms. However, graphene provides extremely high thermal and electrical conductivity in directions within the plane of atoms but only about 2.3% of white light that strikes it is absorbed. Similarly about 2% to 5% of the thermal energy spectrum radiated orthogonally at the place of atoms is absorbed while radiative heat rays parallel to separated architectural construct layers can be transmitted with even less attenuation. The net amount of light that an architectural construct absorbs depends in part on the orientation of successive layers relative to one another. Variations in the orientations of layers of an architectural construct, as discussed above with reference to FIGS. 1A-C, can enable various new applications. For example, radiative energy can be delivered to sub-surface locations via more absorptive orientations, such as the orientation shown in FIG. 1B. As another example, radiation can be polarized via orientations such as that shown in FIG. 1C, and this orientation can be further modified by offsetting a layer in the direction of its plane by a certain amount, such as described above with respect to FIGS. 1A and 1B. For a further discussion of graphene's properties, optical and otherwise, see R. R. Nair, P. Blake, A. N. Grigorenko, K. S. Novoselov, T. J. Booth, T. Stauber, N. M. R. Prees and A. K. Geim, *Fine Structure Constant Defines Visual Transparency of Graphene*, 320 SCIENCE 1308 (2008); A. B. Kuzmenko, E. van Heumen, F. Carbone, and D. van der Marel, *Universal Optical Conductance of Graphite*, DPMC, University of Geneva, 1211 Geneva 4, Switzerland (2008).

Some crystalline substances, like graphene, graphite, and boron nitride, readily conduct heat in certain directions. In some applications, an architectural construct composed of one of these substances is configured to transfer heat between two locations or away from or to a particular location. In other applications, the architectural construct is configured so that heat may be efficiently transferred into and out of the construct as needed. An architectural construct composed of a substance like graphene can be rapidly heated or cooled. Despite having a much lower density than metal, an architectural construct can conductively transfer a greater amount of heat in desired directions per unit area than solid silver, raw graphite, copper, or aluminum.

An architectural construct can be arranged to have a high availability for conductively transferring heat by configuring the construct so it has a high concentration of thermally conductive pathways through a given cross section of the construct. An architectural construct can be arranged to have a low availability for conductively transferring heat by configuring the construct so it has a low concentration of thermally conductive pathways through a given cross section of the construct. For example, FIG. 7 shows an architectural construct 700 configured as parallel layers that are rectangular and supported by a central support structure 703. A first set 710 of parallel layers are an atom thick and are spaced a first distance away from one another. A second set 720 of layers are an atom thick and are spaced a second distance away from one another that is greater than the first distance. Because there is a higher concentration of thermal passageways over the span of the first set 710 of parallel layers than over the span of the second set 720 of layers (and the sets of layers span approximately the same distance), the first set has a higher availability for conductively transferring heat than the second set. It follows that the second set 720 does a better job than the first set 710 at thermally insulating an object located at a first side 701 of the construct from an object located on a second side 702. In some implementations, an architectural construct configured as parallel layers is arranged to insulate a surface that the layers are not orthogonal to. For example, the architectural construct can be configured so its layers contact a flat surface at an angle such as 45 degrees by offsetting the edges of consecutive layers by a particular amount so that the layers achieve this angle with the surface when placed against it. In some implementations, an architectural construct is arranged to have a higher availability for conductively transferring heat by configuring it having thicker layers. For example, referring again to FIG. 5, there is a higher availability for thermally transferring heat through the second set 520 of layers than through the first set 510 because the second set of layers is thicker than the first and spaced closer together. In some implementations, an architectural construct includes surface structures, such as on the construct 1000 shown in FIG. 10, which facilitates the conductive transfer of heat within the construct.

As discussed below with reference to an architectural construct's electromagnetic and optical properties, an architectural construct can be arranged to transmit, diffract, reflect, refract, or otherwise transform radiant energy. Accordingly, an architectural construct may be configured to interact in a specific way with radiant heat. In some implementations, an architectural construct is configured to transmit radiant heat through passageways within the construct. This transfer of radiant heat can enable endothermic or exothermic reactions at the speed of light. A construct's properties related to radiant heat transfer can be altered by including surface structures on the layers of the construct, which may absorb or reflect specific wavelengths.

Radiation gratings with various slot widths can be fabricated as spacings between layers or by electron beam lithography (e-beam) and their infrared transmission of the transverse magnetic mode (TM mode) provides for Fourier Transform Infrared Spectroscopy (FTIR). This provides the basis of systems that serve as infrared photodetectors, biochip sensors, and light-emitting diode polarizers. U.S. patent application Ser. No. 12/064,341, filed on Aug. 4, 2008 and titled "INFRARED COMMUNICATION APPARATUS AND INFRARED COMMUNICATION METHOD," the teachings of which are incorporated herein by reference, describes some exemplary systems.

Referring again to FIG. 7, the second set 720 of layers may be spaced apart a particular distance, be composed of a particular substance, and be configured a particular thickness so that incident infrared energy that is parallel to the layers enters and is transmitted through zones between the layers. For example, to transmit radiant energy of a particular frequency, an architectural construct can be comprised of layers of boron nitride that are spaced apart according to quantum mechanics relationships. Similarly, as previously noted, an architectural construct can also be configured to specifically absorb radiant energy. For example, the layers of the first set 710 of layers may be spaced apart a particular distance, be composed of a particular substance, and be a particular thickness so that at least a portion of incident infrared energy is absorbed by the layers. Opacity of each individual layer or of a suspended layer is 2.3% of the orthogonal radiation as established by quantum electrodynamics. Opacity of a group of layers depends upon their spacings, orientations of the architectural construct's layers, and the interactions of relativistic electrons within the layers and the selection of spacers, such as the surface structures.

An architectural construct can also be arranged to insulate an object from radiative energy, including radiant heat. In some implementations, an architectural construct insulates an object from radiant heat by reflecting the radiant energy or by transmitting the radiant energy through passageways around or away from the object. For example, referring to FIG. 4, an architectural construct can be configured to insulate an object placed on the right side of the architectural construct 400 from a radiation source on the left side of the construct.

An architectural construct's thermal properties can also be changed by adding a coating to surfaces of the construct or by doping the construct. For example, referring again to FIG. 4, the architectural construct 400 can be doped as it is self-organized or by diffusion or ion implantation to increase its thermal conductivity generally or in specific areas or directions. It can be coated with metals, such as aluminum, silver, gold, or copper, to reflect more radiant heat than it would have otherwise.

II. Acoustic, Electromagnetic, and Optical Properties

Architectural constructs can be made to exhibit specific properties in response to radiant or acoustic energy. They can be configured to acoustically and/or electromagnetically resonate at specific frequencies. They can also be constructed to have a particular index of refraction, and they can be designed to shift the frequency of incident electromagnetic waves. These properties can be controlled by arranging a construct to have a particular configuration, including a specific density, modulus of elasticity, and section modulus. As discussed above, these parameters can be adjusted by changing the composition of an architectural construct, its treatment, and its design.

An architectural construct's acoustic resonance frequency changes with a number of factors. A dense architectural construct will resonate at a lower frequency than one that is less dense and otherwise identical. Accordingly, when an architectural construct is configured as parallel layers, a thin layer will have a higher resonant frequency than a thicker layer. An architectural construct supported firmly on its edges will resonate at a lower frequency than one that is supported at its center. Additionally, an architectural construct with a high modulus of elasticity will resonate at a greater frequency than one with a low modulus of elasticity, and an architectural construct with a high section modulus will resonate at a lower frequency than an architectural construct with a smaller section modulus. For example, referring again to FIG. 5, the second set 520 of layers has an acoustic resonance frequency that is lower than that of the first set 510 of layers. This is because the layers of the second set are thicker than those of the first set and they are spaced a shorter distance apart from one another, but they are otherwise identical. The resonance frequency of any of the layers of the second set 520 or the first set 510 can be reduced by making the diameter of the layers larger. In some implementations, all the layers of an architectural construct are designed to resonate at the same frequency. An architectural construct's resonant frequency will also depend on its composition. Additionally, in some implementations, dopants and/or coatings are added to an architectural construct to increase or reduce its acoustic resonance frequency. An architectural construct's resonance frequency can also be reduced by adding spacers, including surface structures, between the layers.

An architectural construct can also be configured to resonate electromagnetically at a particular frequency. For example, its density, modulus of elasticity, and section modulus can be chosen for each layer so that the construct or each layer has a particular resonance frequency. For example, referring again to FIG. 5, the second set 520 of layers may have a lower electromagnetic resonant frequency than the first set 510 of layers because the second set has thicker layers than the first set and they are configured closer together than the layers of the first set. In some implementations, an architectural construct is doped, and its electromagnetic resonance frequency increases or decreases as a result of the doping.

An architectural construct may also be configured to absorb radiant energy that is a particular wavelength. A number of factors influence whether an architectural construct will absorb radiant energy that is a particular wavelength. For example, referring to FIG. 4, the ability of the architectural construct 400 to absorb radiant energy that is a particular wavelength depends on the layers' thicknesses, their spacing, their composition, their dopants, their spacers (including surface structures), and their coatings. In some implementations, an architectural construct is configured to transmit radiant energy that is a first wavelength and absorb and re-radiate energy that is a different wavelength from the received radiant energy. For example, referring again to FIG. 4, the architectural construct 400 may be configured so that the layers are parallel to some but not all incident radiant energy. The parallel layers can be configured to transmit radiant energy that is parallel to the layers through the construct and absorb non-parallel radiation. In some implementations, a re-radiative substance (e.g., silicon carbide, silicon boride, carbon boride, etc.) is coated on the surfaces of the architectural construct, such as by chemical vapor deposition, sputtering, or otherwise spraying the architectural construct with the substance. Then, when non-parallel radiation contacts the architectural construct, the re-radiative substance absorbs the non-parallel radiation and re-radiates the energy at a different wavelength than the energy was received at. For example, silicon carbide can be applied to an architectural construct by making silicon available to form solid solutions and stoichiometric compounds.

As mentioned in the previous example and discussed above with respect to radiant heat, an architectural construct can be configured to transmit radiant energy through radiant passageways in the construct (e.g., through zones between layers). As mentioned above, thermal radiation can be transferred at the speed of light in the areas between the layers. For example, the distance separating the layers of the architectural construct 300 shown in FIG. 3 creates zones 330 between the layers through which radiant energy can be transferred. In some implementations, the sizes of the zones between the layers can be increased allowing more radiant energy to be transmitted. In some implementations, the layers of an architectural construct are spaced apart to polarize incident electromagnetic waves. Also, as discussed above, an architectural construct can be configured to insulate an object from radiation. In some implementations, an architectural construct insulates an object from radiation by reflecting the radiant energy. For example, referring to FIG. 4, the architectural construct 400 can be configured to insulate an object placed on the right side of the architectural construct 400 from radiation on the left side of the construct. For example, each layer can be composed of boron nitride, and be spaced apart to reflect electromagnetic radiation within specified wavelengths.

An architectural construct can also be configured to have a particular index of refraction (i.e., an index of refraction within a particular range or an exact value). An architectural construct's index of refraction is a function of, among other variables, the composition of the layers (e.g., boron nitride, graphite, etc.), the thicknesses of the layers, dopants, spacers (including surface structures), and the distances that separate the layers. Referring to FIG. 4, the distance 440 between the parallel layers 400, and the thicknesses of the layers, may be selected so that the parallel layers 400 have a particular index of refraction. For example, the layers can be comprised of graphite to have an index of refraction that is adjusted by the spacing between layers and/or by the addition of adsorbed and/or absorbed substances within the spacings. Additionally, in some implementations, dopants are added to an architectural construct to change its index of refraction. For example, layers of an architectural construct comprised of boron nitride may be doped with nitrogen, silicon or carbon to increase or decrease its index of refraction.

An architectural construct's index of refraction may change when a substance is loaded into the architectural construct. For example, an architectural construct existing in a vacuum may have a different index of refraction than when hydrogen is loaded into the construct and expressed as epitaxial layers and/or as capillaries between the epitaxial layers. In some implementations, the index of refraction of a first portion of an architectural construct is different from the index of refraction of a second portion of the architectural construct. For example, referring to FIG. 5, the first set 510 of layers may have a different index of refraction than the second set 520 of layers because the first set of layers is thinner and is spaced apart by a greater distance than the layers in the second set of layers.

An architectural construct can be configured to have a particular diffraction grating by orienting its layers relative to one another in a particular way. As a result, incident electromagnetic waves will diffract through layers of the architectural construct in a predictable pattern. In some implementations, by passing light through layers of an architectural construct and observing how the light is diffracted and refracted (e.g., by observing the diffraction pattern that is produced, if it exists, and the angle that the light is refracted at), it can be determined what unknown substance is loaded between the layers. For example, an architectural construct may be configured so that atoms from a first layer are aligned with atoms from a second layer when viewed from a position perpendicular to the construct, like in FIG. 1A, producing a predictable diffraction pattern when light is passed through the construct. As discussed above with reference to FIGS. 1A-C, layers of a construct (either spaced apart or stacked atop one another) may be oriented in different ways by offsetting or rotating one layer relative to the other.

III. Catalytic Properties

An architectural construct can be configured to catalyze a reaction in a variety of ways. For example, an architectural construct comprised of parallel layers, like those of FIGS. 3-5, may catalyze a chemical reaction or a biological reaction at an edge of its layers by controlling the temperature of the reaction, by having a particular configuration that catalyzes the reaction, or by supplying a substance that catalyzes the reaction. An architectural construct can catalyze a reaction by speeding the reaction up, prolonging the presentation of reactants to promote a reaction, enabling the reaction by heat addition or removal, or by otherwise facilitating the reaction.

A number of variables can be changed to catalyze a particular reaction. In some implementations, the thicknesses of the layers of an architectural construct are selected so that a reaction is catalyzed. In some implementations, the distances between layers and/or the layers' compositions (e.g., boron nitride, carbon, etc.) are selected so that a reaction is catalyzed. In some implementations, dopants are added to an architectural construct or spacers (including surface structures) of a particular chemistry are added between layers so that a particular reaction is catalyzed.

In some implementations, the parallel layers catalyze a reaction by transferring heat to a zone where a reaction is to occur. In other implementations, the parallel layers catalyze a reaction by transferring heat away from a zone where a reaction is to occur. For example, referring again to FIG. 3, heat may be conductively transferred into the parallel layers 300 to supply heat to an endothermic reaction within the support tube 310. In some implementations, the parallel layers catalyze a reaction by removing a product of the reaction from the zone where the reaction is to occur. For example, referring again to FIG. 3, the parallel layers 300 may absorb alcohol from a biochemical reaction within the support tube 310 in which alcohol is a byproduct, expelling the alcohol on outer edges of the parallel layers, and prolonging the life of a microbe involved in the biochemical reaction.

In some implementations, a first set of parallel layers is configured to catalyze a reaction and a second set of parallel layers is configured to absorb and/or adsorb a product of the reaction. For example, referring again to FIG. 5, the second set 520 of layers may be configured to catalyze a chemical reaction by enabling the reaction between two molecules and the first set 510 of layers may be configured to adsorb a product of the reaction, thus prolonging the length of the chemical reaction.

A reaction can be catalyzed in other ways as well. In some implementations, an architectural construct is electrically charged to catalyze a reaction proximate the construct. In some implementations, an architectural construct is configured to resonate acoustically at a particular frequency, causing molecules to orient themselves in a way that catalyzes a reaction. For example, the molecules may be oriented to enable a chemical reaction or their adsorption onto the layers. In some implementations, an architectural construct is configured to transmit or absorb radiant energy to catalyze a reaction. For example, referring to FIG. 5, the second set 520 of layers may be configured to absorb radiant energy and transform the radiant energy into heat that the first set 510 of layers uses to facilitate an endothermic reaction. Similarly, surface structures may be configured to absorb radiant energy to heat the construct and facilitate a reaction.

In some implementations, a catalyst is added to an architectural construct to catalyze a reaction proximate to the construct. The catalyst may be applied on the edges of layers of the construct or on the surfaces of the construct. For example, chromia may be applied on the edges of an architectural construct, and the chromia may catalyze a chemical reaction between methane and ozone produced from air using ionized ultraviolet radiation or an induced spark.

IV. Capillary Properties

An architectural construct configured as parallel layers may be arranged so that liquid moves between its layers via a capillary action. Any of a number of variables can be changed so that the parallel layers can perform a capillary action with respect to a particular substance. In some implementations, the layers' composition, surface structures, dopants, and/or thicknesses are selected so that an architectural construct performs a capillary action with respect to a particular substance. In some implementations, the distances between the layers are selected so that the architectural construct performs a capillary action with respect to a particular substance. For example, referring to FIG. 6, each concentric layer of the architectural construct 600 may be spaced a capillary distance apart from one another for water, and the architectural construct can force or otherwise deliver water up the construct via capillary action.

An architectural construct may be comprised of some layers that are a capillary distance for a first molecule and some layers that are a capillary distance for a second molecule. For example, referring to FIG. 5, the first set 510 of layers may be a capillary distance with respect to a first molecule, such as propane, and the second set 520 of layers may perform a capillary action with respect to a second molecule, such as hydrogen. In this example, hydrogen is adsorbed to the adjacent graphene layers and additional hydrogen may be absorbed between the boundary layers of hydrogen as provided for specific outcomes by the architectural construct design. Additionally, in some implementations, an architectural construct is configured so that heat can be transferred into or out of the construct to facilitate capillary action or a charge can be applied to the layers of an architectural construct to facilitate the capillary action.

V. Sorptive Properties

An architectural construct that is arranged in parallel layers may be configured to load a substance into zones between the layers. A molecule of a substance is loaded between parallel layers when it is adsorbed onto the surface of a layer or absorbed into the zones between the layers. For example, referring back to FIG. 3, the architectural construct 300 may load molecules of a substance presented at an inside edge 340 of the layers into the zones 330 between the layers. The support tube 310 may supply the substance through perforations 350.

A number of factors affect whether an architectural construct will load molecules of a substance. In some implementations, the architectural construct is configured to transfer heat away from the zones where a molecule is loaded from. When an architectural construct is cooled, it may load molecules faster or it may load molecules that it was unable to load when it was hotter. Similarly, an architectural construct may be unloaded by transferring heat to the construct. In some implementations, an architectural construct is configured to load molecules at a faster rate or at a higher density when an electric charge is applied to the construct. For example, graphene, graphite, and boron nitride are electrically conductive. An architectural construct composed of these materials may be configured to load molecules at a higher rate when an electric charge is applied to its layers. Additionally, as mentioned above, in some implementations, an architectural construct can be configured to acoustically resonate at a particular resonant frequency. An architectural construct may be configured to resonate at a specific frequency so that particular molecules proximate to the construct are oriented favorably so that they can be loaded into the zones between the layers.

In some implementations, an architectural construct is configured to load or unload a substance when radiant energy is directed at the construct. For example, referring to FIG. 3, the distance 320 between each of the parallel layers 300 may be selected so that the architectural construct absorbs infrared waves, causing the layers to heat up and unload molecules of a substance that it has loaded. As discussed above, in some implementations, a catalyst can be applied to the outside edges of the layers to facilitate the loading of substances into the zones between the layers.

In some implementations, an architectural construct is configured to selectively load a particular molecule or molecules (e.g., by loading a first molecule and refraining from loading a second molecule). For example, referring again to FIG. 5, the first set 510 of layers may be configured so that they are a particular distance apart that facilitates the selective loading of a first molecule and not a second molecule. Similarly, the second set 520 of layers may be configured so that they are a particular distance apart to facilitate the loading of a third molecule but not the second molecule. Surface tension at edges of the layers will also affect whether a molecule is loaded into an architectural construct. For example, if the first set 510 of layers has already loaded molecules of a first substance, surface tension at the inside edges of the first set 510 of layers where molecules of the substance are loaded from may prevent the first set 510 of layers from loading molecules of the second substance but allow the first set 510 of layers to continue to load molecules of the first substance.

Figure 10:
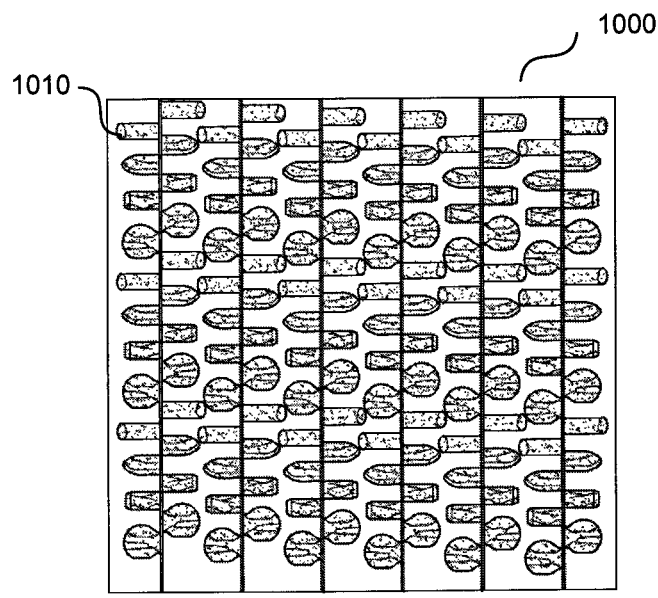
FIG. 10 is a side view of an architectural construct configured as parallel layers.

In some implementations, an architectural construct includes surface structures configured on its surfaces that facilitate in the loading and unloading of substances into and out of the construct. Surface structures can be epitaxially oriented by the lattice structure of a layer to which they are applied. In some embodiments, they are formed by dehydrogenating a gas on the surface of the layers. In other embodiments, they are coated on a layer before adjacent layers are configured on the construct. FIG. 10 shows an architectural construct 1000 that includes parallel layers that have surface structures 1010 configured thereon. The surface structures 1010 include nano-tubes, nano-scrolls, rods, and other structures.

Surface structures can enable an architectural construct to load more of a substance or load a substance at a faster rate. For example, a nano-flower structure can absorb molecules of a substance into an area within the structure and adsorb molecules of the substance on its surface. In some embodiments, the surface structures enable the architectural construct to load a particular compound of a substance. In some embodiments, the surface structures enable the architectural construct to load and/or unload molecules of a substance more rapidly. In some embodiments, a particular type of surface structure is preferred over another surface structure. For example, in some embodiments, a nano-scroll may be preferred over a nano-tube. The nano-scroll may be able to load and unload molecules of a substance more quickly than a nano-tube can because the nano-scroll can load and unload layers of multiple molecules of a substance at the same time while a nano-tube can only load or unload through a small area at the tube ends along the axis. In some embodiments, a first type of surface structure loads a first compound and a second type of surface structure loads a second compound. In some embodiments, surface structures are composed of material that is electrically conductive and/or has a high availability for thermal transfer. In some embodiments, surface structures are composed of at least one of carbon, boron, nitrogen, silicon, sulfur, transition metals, mica (e.g., grown to a particular size), and various carbides or borides.

Figure 11:
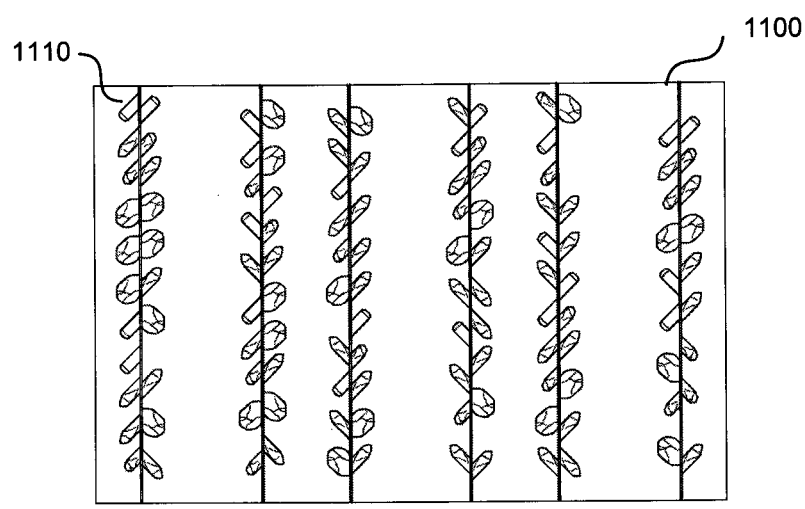
FIG. 11 is another side view of an architectural construct configured as parallel layers.

As is shown in FIG. 10, in some embodiments, surface structures are oriented perpendicular to the surfaces of the architectural construct. In other embodiments, at least some of the surface structures are not oriented perpendicular to the surface that they are applied on. In FIG. 11, surface structures 1110 are oriented at different angles from the surfaces of an architectural construct 1100 than 90-degrees. A surface structure may be oriented at a particular angle to increase the surface area of the surface structure, to increase the rate that molecules are loaded by the surface structure, to increase a loading density of the surface structure, to preferentially load a molecule of a particular compound, or for another reason. Surface structures can be configured, including inclination at a particular angle, by grinding, lapping, laser planning, and various other shaping techniques.

In some implementations, surface structures are configured on an architectural construct and are composed of a different material than the construct. In FIG. 10, for example, the layers of the architectural construct 1000 may be composed of graphene and the surface structures 1010 may be composed of boron nitride. The surface structures can be composed of other materials, such as boron hydride, diborane ($B_2H_6$), sodium aluminum hydride, $MgH_2$, LiH, titanium hydride, and/or another metal hydride or metallic catalyst, non-metal or a compound.

Further Implementations

An architectural construct can be designed at a macro level to utilize one or more of the properties discussed above to facilitate micro-processing on a nano-scale. Among the applications for which architectural constructs are useful include as a charge processor, a molecular processor, and a bio processor.

An architectural construct configured as a charge processor can be used to build microcircuits, detect the presence of a particular atom or molecule in an environment, or achieve another result. In some implementations, an architectural construct configured as a charge processor forms an electrical circuit. For example, parallel layers of graphene, like those shown in FIG. 4, can be spaced apart by dielectric materials so that the architectural construct stores an electric charge and functions like a capacitor. In some implementations, an architectural construct, like the architectural construct 400 shown in FIG. 4, is configured as a high-temperature capacitor by isolating parallel layers of the construct with a ceramic. In some implementations, an architectural construct, like the architectural construct 400 shown in FIG. 4, is configured as a low-temperature capacitor by isolating parallel layers with a polymer. In some implementations, an architectural construct is configured for processing ions. For example, the architectural construct 400 can be configured with a semi-permeable membrane covering the zones between the layers of the construct. The semi-permeable membrane allows particular ions to penetrate the membrane and enter the architectural construct where they are detected for a particular purpose. In some implementations, an architectural construct is configured as a solid-state transformer.

An architectural construct can also be configured as a molecular processor. As discussed above, in some implementations, material from the architectural construct participates in a chemical reaction. Additionally, in some implementations, an architectural construct can transform electromagnetic waves at a molecular level. For example, an architectural construct can be configured to transform in input such as 100 BTU of white light into an output such as 75 BTU of red and blue light. The white light is wave-shifted by chemically resonating the white light to transform it into the blue and red light. For example, the architectural construct 400 shown in FIG. 4 can be composed of carbon with selected zones converted to a solid solution or compound such as a carbide with reactants such as boron, titanium, iron, chromium, molybdenum, tungsten, and/or silicon, and the construct can be configured so that the layers are oriented to shift white light into desired wavelengths such as red and/or blue light and/or infrared frequencies.

An architectural construct configured as a bio processor may be used to create enzymes, carbohydrates, lipids, or other substances. In some implementations, an architectural construct is configured as parallel layers and it removes a product of a biochemical reaction from a reaction zone so that the biochemical reaction can continue. For example, the architectural construct 300 shown in FIG. 3 may be configured to load a toxic substance, like alcohol, from a reaction zone within the support tube 310. By removing the toxic substance, a microbe involved in the biochemical reaction will not be killed and the biochemical reaction can continue unabated. In other implementations, an architectural construct can be configured to remove and/or protect and/or orient and present a useful product such as hydrogenase of a biochemical process or reaction from a reaction site without having to interrupt the reaction. In another example, the support tube 310 within the architectural construct 300 shown in FIG. 3 may house a biochemical reaction that produces a useful lipid, which is loaded into the zones 330 between the layers of the construct and unloaded on the outside edges of the zones. Therefore, the biochemical reaction can continue while the useful product is removed.

From the foregoing, it will be appreciated that specific embodiments of the invention have been described herein for purposes of illustration, but that various modifications may be made without deviating from the spirit and scope of the invention. Accordingly, the invention is not limited except as by the appended claims.

To the extent not previously incorporated herein by reference, the present application incorporates by reference in their entirety the subject matter of each of the following materials: U.S. patent application Ser. No. 08/921,134, filed on Aug. 29, 1997 and titled COMPACT FLUID STORAGE SYSTEM; U.S. patent application Ser. No. 09/370,431, filed on Aug. 9, 1999 and titled COMPACT FLUID STORAGE SYSTEM; and U.S. patent application Ser. No. 12/857,461, filed on Aug. 16, 2010 and titled INTERNALLY REINFORCED STRUCTURAL COMPOSITES AND ASSOCIATED METHODS OF MANUFACTURING.

I claim:

1. An architectural construct designed to facilitate microscale processing on a nano-scale and configured to have an acoustic resonant frequency, the architectural construct comprising:
   a first layer comprised of a matrix characterization of crystals and having a first thickness; and
   a second layer comprised of a matrix characterization of crystals and having a second thickness,
   wherein:
      the first and second layers are arranged so that they are parallel to each other,
      the matrix characterization of crystals of the first layer and the matrix characterization of crystals of the second layer are arranged in (i) an aligned orientation or (ii) one or both of a translationally offset orientation and a rotationally offset orientation,
      the first and second layers are separated by a distance, in which a zone exists between the first and second layers,
      the first layer is configured to acoustically resonate at a first resonant frequency, and
      the second layer is configured to acoustically resonate at a second resonant frequency,
   wherein the distance between the first and second layers, orientation of the matrix characterization of crystals of the first and second layers, and the first and second thicknesses are selected such that the architectural construct acoustically resonates at a predetermined resonant frequency.

2. The architectural construct of claim 1, wherein the first and second layers are separated by one or more spacer molecules or atoms.

3. The architectural construct of claim 1, wherein the first and second layers are configured on a support structure.

4. The architectural construct of claim 1, wherein the first thickness is equal to the second thickness and the first resonant frequency is equal to the second resonant frequency.

5. The architectural construct of claim 1, wherein the first and second layers are primarily comprised of boron nitride or carbon.

6. The architectural construct of claim 1, further comprising a dopant in at least one of the first and second layers.

7. The architectural construct of claim 6, wherein the dopant is presented on an edge of the first layer or the second layer.

8. An architectural construct designed to facilitate microscale processing on a nano-scale and configured to have a predetermined index of refraction, the architectural construct comprising:
   a first layer comprised of a matrix characterization of a crystal in a first portion of the architectural construct and having a first thickness; and
   a second layer comprised of a matrix characterization of a crystal in a second portion of the architectural construct and having a second thickness,
   wherein:
      the first and second layers are arranged so that they are parallel to each other,
      the matrix characterization of the first layer and the matrix characterization of the second layer are arranged in (i) an aligned orientation or (ii) one or both of a translationally offset orientation and a rotationally offset orientation,
      the first and second layers are separated by a distance, in which a zone exists between the first and second layers, and
      the architectural construct is configured to have a predetermined index of refraction,
   and wherein the first and second thicknesses are different thicknesses such that the predetermined index of refraction of the first portion is different than that of the second portion.

9. The architectural construct of claim 8, wherein the first and second layers are primarily comprised of carbon or boron nitride.

10. The architectural construct of claim 8, further comprising:
    a third layer comprising a matrix characterization of a crystal and having a third thickness; and
    a fourth layer comprising a matrix characterization of a crystal and having a fourth thickness,
    wherein:
       the third and fourth layers are arranged so that they are parallel to the first and second layers,
       the third and the fourth layers are separated by a second distance, and
       the architectural construct has a different index of refraction through the first and second layers than it does through the third and fourth layers.

11. The architectural construct of claim 8, wherein the distance between the first and second layers is selected such that the architectural construct has the predetermined index of refraction.

12. The architectural construct of claim 8, further comprising one or more spacer molecules or atoms to separate the first and second layers by the distance.

13. The architectural construct of claim 8, further comprising a dopant in at least one of the first and second layers.

14. The architectural construct of claim 13, wherein the dopant is presented on an edge of the first layer or the second layer.

15. An architectural construct designed to facilitate microscale processing on a nano-scale and configured to transmit radiant energy, the architectural construct comprising:
    a first layer comprised of a matrix characterization of a crystal and having a first thickness; and
    a second layer comprised of a matrix characterization of a crystal and having a second thickness,
    wherein:
       the first and second layers are arranged so that they are parallel to each other,
       the matrix characterization of the first layer and the matrix characterization of the second layer are arranged in (i) an aligned orientation or (ii) one or both of a translationally offset orientation and a rotationally offset orientation,
       the first and second layers are separated by a distance, in which a zone exists between the first and second layers, and wherein the first layer is configured to transmit radiant energy of a first particular wavelength and the second layer is configured to transmit radiant energy of a second particular wavelength through the zone between the layers.

16. The architectural construct of claim 15, wherein the distance between the first and second layers and the first and second thicknesses is selected such that the architectural construct transmits radiant energy of the particular wavelength through the zone between the layers.

17. The architectural construct of claim 15, wherein the first and second layers are separated by one or more spacer molecules or atoms.

18. The architectural construct of claim 15, wherein the first and second layers are configured on a support structure.

19. The architectural construct of claim 15, wherein the first and second layers are primarily comprised of boron nitride or carbon.

20. The architectural construct of claim 15, further comprising a dopant in at least one of the first and second layers.

21. The architectural construct of claim 20, wherein the dopant is presented on an edge of the first layer or the second layer.

* * * * *